United States Patent
Ribet et al.

(10) Patent No.: US 12,515,947 B2
(45) Date of Patent: Jan. 6, 2026

(54) METHOD AND ARRANGEMENT FOR ASSEMBLY OF MICROCHIPS INTO A SEPARATE SUBSTRATE

(71) Applicants: Federico Ribet, Stockholm (SE); Miku Brodin-Laakso, Södertälje (SE); Simone Pagliano, Stockholm (SE); Frank Niklaus, Täby (SE); Niclas Roxhed, Bromma (SE); Göran Stemme, Lidingö (SE)

(72) Inventors: Federico Ribet, Stockholm (SE); Miku Brodin-Laakso, Södertälje (SE); Simone Pagliano, Stockholm (SE); Frank Niklaus, Täby (SE); Niclas Roxhed, Bromma (SE); Göran Stemme, Lidingö (SE)

(73) Assignee: Sensible Holding B.V., JD Delft (NL)

( * ) Notice: Subject to any disclaimer, the term of this patent is extended or adjusted under 35 U.S.C. 154(b) by 902 days.

(21) Appl. No.: 17/641,559

(22) PCT Filed: Sep. 10, 2020

(86) PCT No.: PCT/SE2020/050851
§ 371 (c)(1),
(2) Date: Mar. 9, 2022

(87) PCT Pub. No.: WO2021/049995
PCT Pub. Date: Mar. 18, 2021

(65) Prior Publication Data
US 2022/0324703 A1    Oct. 13, 2022

(30) Foreign Application Priority Data
Sep. 10, 2019 (SE) .................................. 1930289-2

(51) Int. Cl.
*B81C 3/00* (2006.01)
*B81C 99/00* (2010.01)

(52) U.S. Cl.
CPC ............ *B81C 3/004* (2013.01); *B81C 99/002* (2013.01); *B81C 2203/051* (2013.01);
(Continued)

(58) Field of Classification Search
CPC ....... B81C 3/002; B81C 3/004; B81C 99/002; H01L 24/97; H01L 21/6835;
(Continued)

(56) References Cited

U.S. PATENT DOCUMENTS

| | | | |
|---|---|---|---|
| 7,217,592 B2 * | 5/2007 | Nuggehalli | ............. H01L 24/95 438/107 |
| 11,670,602 B2 * | 6/2023 | Cok | ........................ H01L 24/73 257/48 |

(Continued)

OTHER PUBLICATIONS

International Search Report from corresponding International Application No. PCT/SE2020/050851, mailed on Dec. 4, 2020, 5 pages.

(Continued)

*Primary Examiner* — Alonzo Chambliss
(74) *Attorney, Agent, or Firm* — Tucker Ellis LLP

(57) ABSTRACT

A method for assembling one or more microchips into respective holes in a substrate surface of a separate receiving substrate for microchip insertion that is out-of-plane in relation to the substrate surface. The microchips are placed on the substrate surface and moved by one or more magnetic fields affecting a ferromagnetic layer of each microchip so that the microchips become out-of-plane oriented in relation to the substrate surface and are assembled into the holes.

24 Claims, 10 Drawing Sheets

(52) U.S. Cl.
CPC ............... *H01L 2924/1461* (2013.01); *H01L 2924/15151* (2013.01); *H01L 2924/15153* (2013.01)

(58) Field of Classification Search
CPC ... H01L 2924/1461; H01L 2924/15151; H01L 2924/15153
See application file for complete search history.

(56) References Cited

U.S. PATENT DOCUMENTS

2010/0170086 A1  7/2010  Ramadan et al.
2018/0102352 A1  4/2018  Sasaki et al.

OTHER PUBLICATIONS

Ji Hao Hoo et al., "Wafer-level high density integration of surface mount technology components in through-silicon trenches," Micro Electro Mechanical Systems 2012, IEEE 25th International Conference, dated Jan. 29, 2012, pp. 373-376.

Qasem Ramadan et al.: "Large scale microcomponents assembly using an external magnetic array"; Applied Physics Letters; published on Apr. 23, 2007; 4 pages.

Jun Zou et al.: Development of Three-Dimensional Inductors Using Plastic Deformation Magnetic Assembly (PDMA); IEEE, vol. 51, No. 4; dated Apr. 2003; 9 pages.

A.C. Fischer et al.: Very high aspect ration through-silicon vias (TSVs) fabricated using automated magnetic assembly of nickel wires; Journal of Micromechanics and Microengineering; published Aug. 17, 2012; 10 pages.

\* cited by examiner

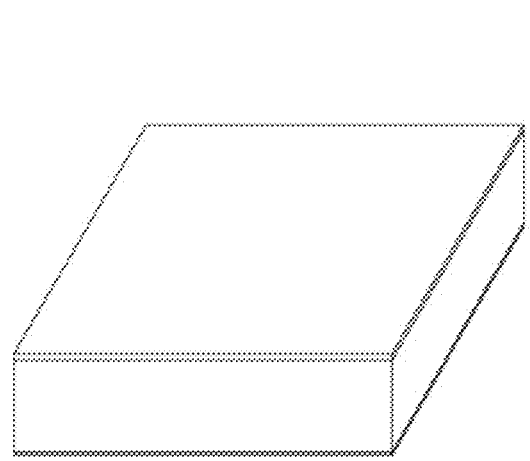
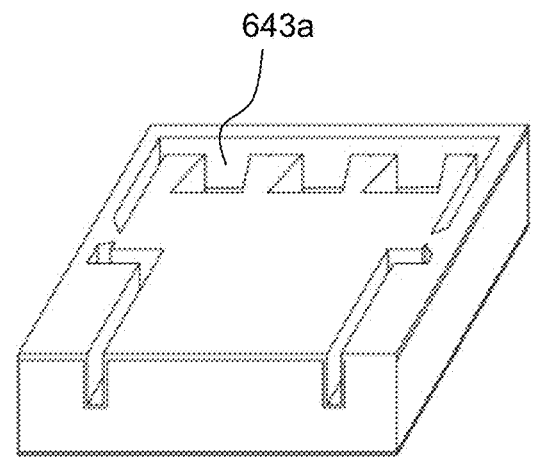
FIG 6A　　　　　　　FIG 6B
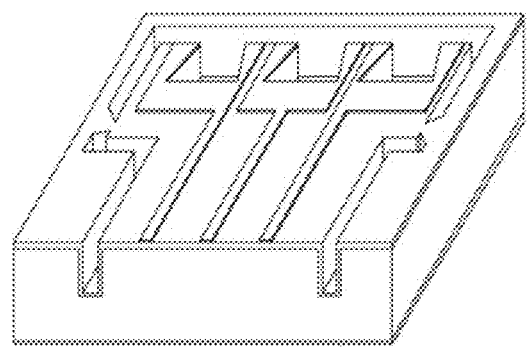
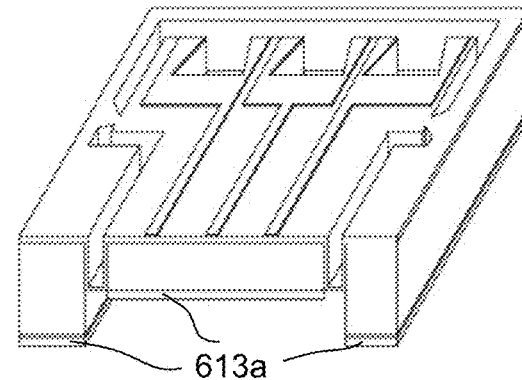
FIG 6C　　　　　　　FIG 6D
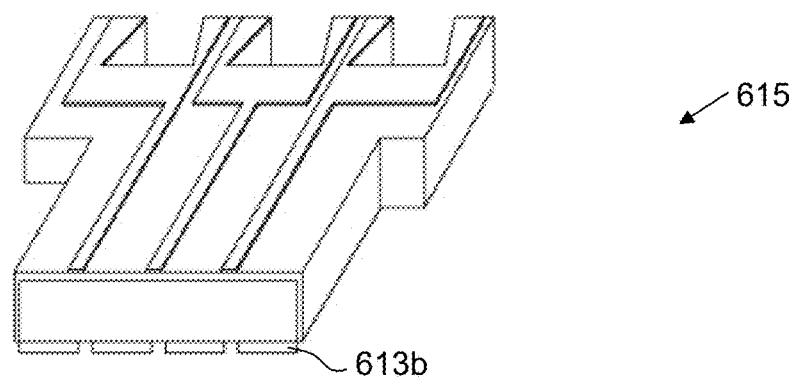
FIG 6E

METHOD AND ARRANGEMENT FOR ASSEMBLY OF MICROCHIPS INTO A SEPARATE SUBSTRATE

TECHNICAL FIELD

Embodiments herein concern a method and arrangement for assembling one or more microchips into a separate, receiving, substrate.

BACKGROUND

Silicon microfabrication techniques are well established, scalable and cost-efficient. However, they typically do not allow the creation of complex three-dimensional (3-D) structures. At the same time, many emerging microelectromechanical system (MEMS) applications such as inductors, RF antennas, optical attenuators, flow sensors, and biosensors require vertical, i.e. out-of-plane structures, in relation to a substrate, with complex three-dimensional (3-D) geometries to fulfil their function. Therefore, the assembly and electrical packaging of micromachined in-plane structures into out-of-plane functional devices has become a need and challenge for MEMS integration.

An important subgroup of components for MEMS integration is microchips. A microchip in this context is a piece of planar substrate, which can be typically made of semiconductor, insulating (e.g. glass), metallic or polymeric material, most typically silicon, having integrated by micro-manufacturing methods (e.g. thin-film deposition, lithography, etching, micro-printing, plating, etc.) one or more electrical circuits and/or micro-electro-mechanical system (MEMS) and/or bio-chemical functions and/or purely micro-mechanical functions, typically in at least one of its two opposite major surfaces.

Due to their inherent "chip" shape, out-of-plane assembly on a separate substrate, in relation to a surface of the substrate is often particularly challenging.

A predominant and natural way to assemble a microchip, particularly out-of-plane, e.g. perpendicularly or vertically, on a separate receiving substrate, is to mechanically contact, e.g. grip, move and put the microchip with the desirable orientation to the location for assembly on the substrate, e.g. by means of a robot. This may be referred to as "pick and place".

However, mechanical contacting becomes problematic when the chip dimensions become smaller and the microchips are fragile, as is the case for many MEMS applications, e.g. biosensors. This makes mechanical contacting undesirable to use in many situations or will make such solution too expensive to be of practical interest. There may also be situations with such large amount of microchips to be assembled on a substrate in which individual mechanical contact-based assembly of "pick and place" type becomes too complex and/or time consuming to perform.

An example of an alternative solution to "pick and place" of microchips for assembly on a separate substrate is disclosed in Chia-Shou Chang, Ruoh-Huey Wang, Kuo-Chyuan Chen and Enboa Wu, "Self-assembly of microchips on substrate" 56th Electronic Components and Technology Conference 2006, San Diego, CA, 2006, pp. 6 pp., doi:1109/ECTC.2006.1645859. This solution is based on developed self-assembled monolayers (SAMs) onto a patterned gold surface of the microchips using alkanethiol precursor molecules. On the other hand, the substrate is dipped with hydrophobic liquids on the binding sites. As soon as the hydrophobic pattern on a chip comes into contact with a substrate-binding site, the patterned gold surfaces are selectively wet and adhered to the hydrophobic adhesives of the substrate.

Such solution is however not suitable for assembly of microchips into holes of the substrate, which is the case for some applications, for which "pick and insert" may be the only option at hand.

Further, it is desirable if a solution for assembly, and also electrical contacting, of microchips on the substrate, does not affect the functionality and the fabrication complexity of the planar microchips, hence not involving high temperatures, harsh chemicals, or unconventional materials.

SUMMARY

In view of the above, an object is to provide one or more improvements or alternatives in relation to the prior art, in particular to provide improvements regarding assembly of microchips into a separate receiving substrate, in particular into holes in a substrate surface.

According to a first aspect of embodiments herein, the object is achieved by a method for assembling one or more microchips into one or more holes, respectively, in a substrate surface of a separate receiving substrate. The substrate is obtained. Said holes of the substrate are for microchip insertion out-of-plane in relation to said substrate surface. Said microchips are obtained, each provided with a ferromagnetic layer of ferromagnetic material. The microchips are placed on said substrate surface. It is applied and moved one or more magnetic fields affecting said ferromagnetic layer of each microchip such that the microchips thereby become out-of-plane oriented in relation to said substrate surface and move over the substrate surface until assembled into said holes.

According to a second aspect of embodiments herein, the object is achieved by a microchip assembly arrangement for assembling one or more microchips into one or more holes, respectively, in a substrate surface of a separate receiving substrate. The microchip assembly arrangement is configured to obtain the substrate, the holes thereof for microchip insertion out-of-plane in relation to said substrate surface. The microchip assembly arrangement is further configured to obtain the microchips, each provided with a ferromagnetic layer of ferromagnetic material. Moreover, the microchip assembly arrangement is configured to place the microchips on said substrate surface. The microchip assembly arrangement is also configured to apply and move one or more magnetic fields affecting said ferromagnetic layer of each microchip such that the microchips thereby become out-of-plane oriented in relation to said substrate surface and move over the substrate surface until assembled into said holes.

Embodiments herein thus correspond to a solution with contactless out-of-plane positioning of the microchips on the substrate and movement in such position on the surface, until they assemble into the holes. Further, embodiments herein are versatile, can be applied without affecting functionality of the microchips or the device they may be assembled in. Embodiments herein are suitable both with large amount of microchips to be assembled and suitable to use with small and fragile microchips. Combined with striped ferromagnetic layer, shape matching holes and "T-shaped" microchips, as in some embodiments herein, the orientation control of the microchips is further improved, making the contact less out of lane assembly even more efficient and usable for out-of-plane assembly of microchips.

The method can be applied for several different application devices, e.g. to provide inductors, RF antennas, optical attenuators, and flow sensors, but is particularly suited to assemble e.g. microprobes, separately fabricated with standard planar silicon microfabrication techniques, in hollow microneedles. This is exemplified further below.

Embodiments herein thus provide improvements regarding assembly of microchips into a separate receiving substrate, in particular into holes in a substrate surface.

BRIEF DESCRIPTION OF THE DRAWINGS

Examples of embodiments herein are described in more detail with reference to the appended schematic drawings, which are briefly described in the following.

FIG. 6 schematically shows an example of how an example microchip relevant for some embodiment can be fabricated.

DETAILED DESCRIPTION

Figure 1A:
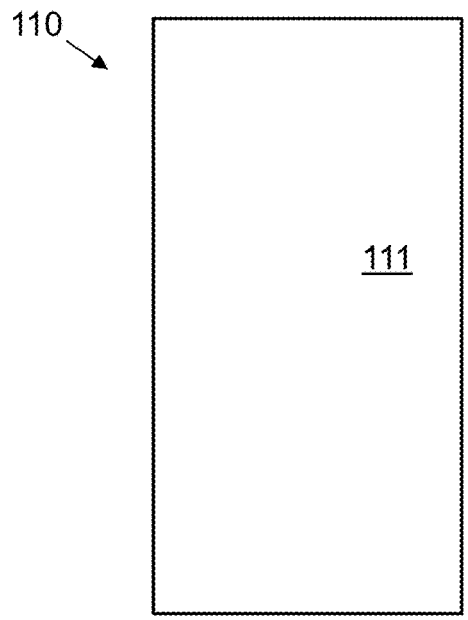
FIG. 1 schematically illustrates a prior art situation and problem.

Throughout the following description similar reference numerals may be used to denote similar elements, units, modules, circuits, nodes, parts, items or features, when applicable. Features that appear only in some embodiments are, when embodiments are illustrated in a figure, typically indicated by dashed lines.

Embodiments herein are illustrated by exemplary embodiments. It should be noted that these embodiments are not necessarily mutually exclusive. Components from one embodiment may be tacitly assumed to be present in another embodiment and it will be obvious to a person skilled in the art how those components may be used in the other exemplary embodiments.

As a development towards embodiments herein, the situation indicated in the Background and ideas underlying embodiments herein will first be discussed.

Figure 1B:
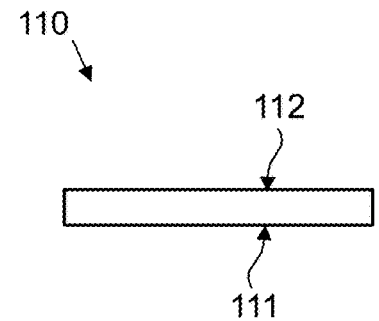
Figure 1C:
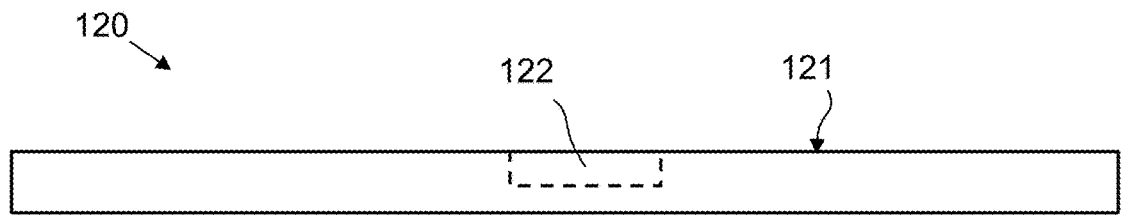
Figure 1D:
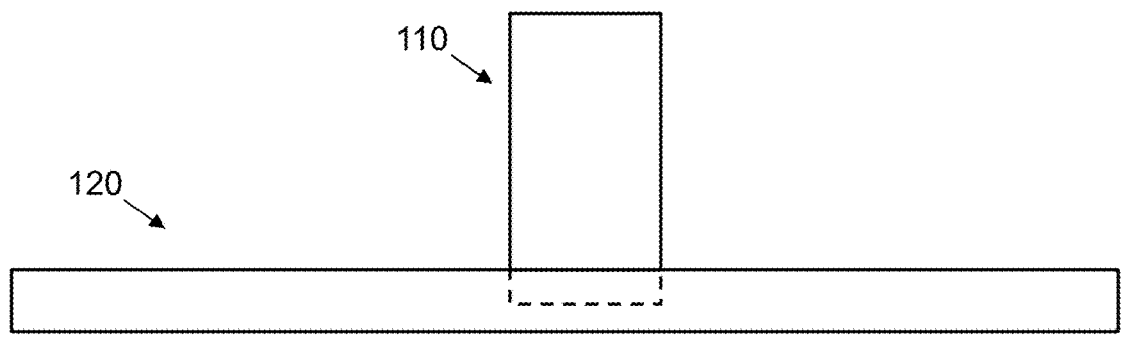

FIGS. 1A-D are for schematically illustrating the situation and problem indicated in the background with out-of-plane assembly of a conventional microchip 110, or microchips, in relation to a substrate surface 121 of a separate substrate 120. More particularly, the microchip 110 is in the example to be assembled into a hole 122, here a blind hole, in the substrate surface 121 with a perpendicular orientation in relation to the substrate surface 121. FIG. 1A shows a planar view of the microchip with a major surface 111 shown, being one of its two major surfaces 111, 112. FIG. 1B shows a top view of the microchip shown in FIG. 1A. FIG. 10 shows the separate substrate 120 with the hole 122 in the substrate surface 121. If placed on the substrate surface 121, the microchip would, as realized, likely end up lying flat. The conventional solution to assemble the microchip in the hole would be to pick it with mechanical contact, e.g. by a robot, place and assembled it into the hole 122 with a required or desirable orientation resulting in what is shown in FIG. 1D.

An idea underlying embodiments herein was to investigate if magnets could be used to accomplish an assembly solution without requiring mechanical "pick and place". This despite the fact that microchips are generally not magnetic, at least not enough to expect that magnetic manipulation is a practical option, and that microchips inherently are "chips", i.e. have planar thin structure that is expected to make them particularly difficult to attain an out-of-plane orientation, such as perpendicular orientation, in relation to a substrate with holes for their assembly.

To perform out-of-plane assembly of other discrete components into receiving holes, vertical insertion of components into through-silicon trenches using magnetic assembly has been proposed in the prior art, as well as magnetic assembly of ferromagnetic metallic wires for through-substrate.

However, the previously proposed solutions either do not allow perpendicular assembly of microchips and/or were only applied to natively-ferromagnetic components. Moreover, directionality of the microchip assembly, which often is critical to the proper functioning of a device, could not be desirably controlled using these methods, e.g. due to that components fall into receiving holes without sufficient control of the resulting orientation.

For example, Hoo, J. H., Park, K. S., Varel, Ç., Baskaran, R. & Böhringer, K. F. "Wafer-level high density integration of surface mount technology components in through-silicon trenches". in IEEE 25th International Conference on Micro Electro Mechanical Systems (MEMS) 373-376 (2012), discloses a method to deliver and assemble standard monolithic ceramic capacitors and thin-film resistors into through-wafer trenches, e.g. for fabrication of microchips. Passive components are chip-surface assembled into vertical trenches etched through the die and thereby chip-volume that will otherwise not be utilized is accessed. Well-established passive components as the capacitors and resistors are used. The components are first distributed onto a wafer, set on wafer processing tape, prepared with corresponding vertical trenches etched through its thickness and magnetic force is introduced to pull the components into the trenches.

It is realized that such solution is generally not compatible nor not well suited as an alternative to the "pick and place" solution discussed in relation to FIG. 1. For example, the microchip 110 is typically not magnetic and if it would happen to be a microchip that for some reason, e.g. due to that its functional design involve magnetic material, this would offer no control of the out of plane orientation it would attain. This means that even if the microchip would be magnetic and if it by that could be made to move over the substrate, it would hardly orient in such way that it can enter and assemble into the hole with a desirable or needed orientation, e.g. perpendicularly to the separate substrate.

However, the inventors found that microchips, in particular such that are not magnetic, can be made suitably magnetic by providing each with a ferromagnetic layer, i.e. a layer of ferromagnetic material that should be parallel with the major surfaces of each microchip, and that this layer can be made relatively thin, e.g. deposited as a thin film, and e.g. be applied during fabrication of the microchips. The ferromagnetic layer may e.g. be provided over the backside of the microchip. Such layer enabled that a magnetic field, e.g. applied by means of a permanent magnet under the separate substrate, then could be used to make the microchip orient in a desirable out-of-plane direction on the substrate surface, e.g. perpendicularly or vertically, with the ferromagnetic layer orienting parallel with the magnetic field. At the same time the microchips could be made to move over the substrate with the out-of-plane orientation they attained on the surface by moving the magnetic field, e.g. by moving the permanent magnet. Further, it was also found that probability for a microchip to take a desirable out-of-plane, e.g. vertical, orientation in the magnetic field, could be increased by making the ferromagnetic layer patterned, e.g. in stripes. The microchip with the stripes would orient itself in the magnetic field so that the stripes line up with the magnetic field. For example, parallel stripes may be used to orient microchips in a, for the assembly desirable, out-of-plane direction determined by the magnetic field lines at the surface of substrate. Hence, the direction of the magnetic field in relation to the surface, e.g. orthogonally to the surface, can be used to control orientation of the microchips and make sure that a microchip will orient in the desirable or needed out-of-plane direction for assembly into a hole.

Further, it was found that this solution advantageously is combined with shape matching holes so that only an intended part, e.g. end of the microchip, is able to enter a hole, i.e. so that an assembled microchip will have an intended position in the hole. This can e.g. be accomplished by that the dimensions of all ends but one of the microchip are too wide to enter the hole.

Moreover, with the ferromagnetic layer patterned into stripes, e.g. straight parallel stripes, a microchip can be made to attain one of two opposite ends facing the substrate with holes and then be moved over the surface. However, by also switching magnetic polarity of the magnetic fields, this tend to also make the microchips switch end that is facing the substrate, except of course for any microchips that already have assembled into the holes. This further increase the probability that a microchips eventually will be assembled into a hole.

Embodiments herein e.g. enable heterogeneous vertical assembly and contacting of silicon microchips for a wide range of applications, including advanced 3-D sensing devices with integrated biosensors and other sensitive and fragile components.

Further advantages and variations regarding embodiments are described and should be clear from the following.

FIG. 2 schematically show different views of an example microchip 215 relevant for embodiments herein. The microchip, although not illustrated in the figure, should be one for assembly into a hole of a separate structure, as discussed above. The hole can e.g. be a blind hole as shown in FIG. 1 or a through hole as shown in examples further below.

Figures 2A, 2B:
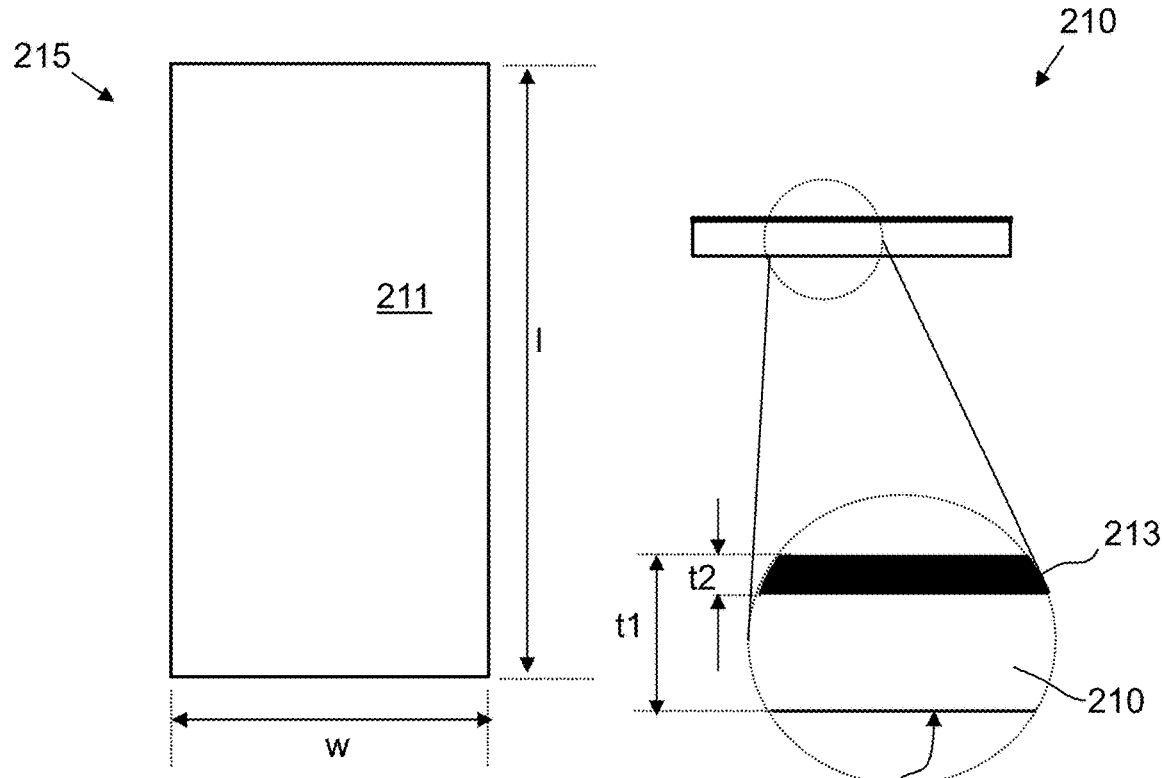
FIG. 2 schematically shows different views of an example microchip relevant for some embodiments herein.

FIG. 2A shows a planar view of the microchip 215 with a major surface 211 shown, being one of its two major surfaces, e.g. the frontside. The microchip 215 has a length l and a width w. As used herein, length of a microchip may refer to the largest dimension of the microchip in the out-of-plane direction for insertion into a hole for assembly, e.g. in a vertical direction as shown in the figure, and width may refer to the largest dimension in the perpendicular direction to this. FIG. 2B shows a top view of the microchip shown in FIG. 2A and with a magnification part. The microchip has been provided with a ferromagnetic layer 213 of ferromagnetic material, e.g. Ni, on the major side not shown in FIG. 2A, e.g. on its backside. The microchip has a total thickness t1 and the ferromagnetic layer a thickness t2.

The microchip 215 comprises a ferromagnetic layer 213 of ferromagnetic material, such as Ni, here on one of its major sides. In the shown example, the ferromagnetic layer 213 covers a whole major surface of the chip. Other examples of ferromagnetic materials that the ferromagnetic layers of embodiments herein, such as the ferromagnetic layer 213, may be made of is Al, Gd, W, Co, Fe, Co2FeAl, FeCo, etc.

The ferromagnetic layer 213 may cover a whole or substantially the whole major surface of the microchip, but may alternatively cover it only partly. The ferromagnetic layer should be in a plane parallel to the major surfaces of the microchip, i.e. be in plane with the planar structure of the microchip. It may be a core layer, or an outer layer, e.g. on a major surface, e.g. backside of the microchip 215.

Figure 2C:
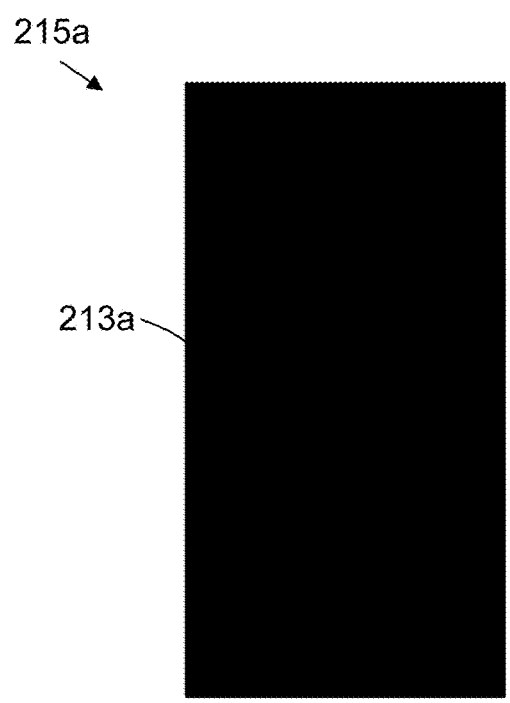
Figure 2D:
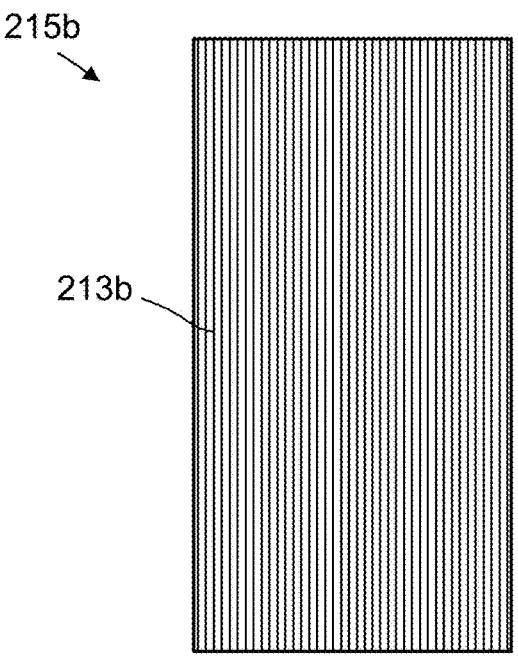

FIG. 2C shows a variant, microchip 215a, of the microchip 215, with a uniform ferromagnetic layer 213a and FIG. 2D shows another variant, microchip 215b, of the microchip 215, with a ferromagnetic layer 213b in the form of a striped pattern. The ferromagnetic layer 213b is here patterned in straight and parallel stripes running along the length of the microchip 215b. As already indicated above and as will be further discussed below, the stripes provide control of the directivity of the microchip in a magnet field. The stripes make it possible to accomplish directivity independent on aspect ratios, i.e. length/width, of the microchips For example, in performed experiments, striped ferromagnetic layers of microchips corresponding to 215b have caused the microchips to lift vertically along the direction of the striping in the presence of a magnetic field. In contrast, a corresponding microchip, e.g. 215a, with a uniform ferromagnetic layer also lifts but typically in the wrong direction, along its long edge.

For example, directional lifting of microchips with different aspect ratios (length/width), ranging from 12 to 0.5, with striped Ni patterns, have been tested and the microchips all lined up with the stripes along the magnetic field. Examples of various lengths widths, thicknesses of microchips relevant for embodiments herein and of the ferroelectric layer are discussed further below.

The stripes may be provided physically separated, i.e. so that the ferromagnetic layer consist of stripes of ferromagnetic material not in contact with each other, or stripes in the surface of a coherent layer.

The stripe(s) may e.g. be provided by etching or other patterning of a deposited uniform layer, or made separately and be attached to the operative part 210 thereafter.

The stripe(s) should be thinner and narrower than they are long, typically much thinner than long. When multiple stripes are present, they are typically parallel, but not necessarily for all embodiments. A stripe as such is, as commonly conceived, an elongated structure, such as a long narrow section differing from parts adjoining it.

Inter-distance can be small as long as the distance between the magnetic domains prevents them to strongly interact with each other from a stripe to another. The width should be enough to allow the magnetic domains to coherently orient within the stripe itself. It may be advantageous in terms of minimum ferromagnetic layer, e.g. Ni layer, thickness and improved chip control to have much wider stripes than their inter-distance.

In some embodiments there is only a single stripe. A single stripe may have corresponding effect as multiple stripe if the total volume of the single stripe and the stripes are approximately the same.

The microchip 215 may, as indicated in the figure, comprise an operative part 210 part that may correspond to a conventional microchip, e.g. 110 above, and that typically has an operative function of its own when used in a device, e.g. MEMS application, post-assembly. The ferromagnetic layer may thus be provided separate from the operative function for assembly purposes.

Note that embodiments herein, some exemplified in the following, involve microchips also with other geometries and proportions than discussed above in relation to FIG. 2, and embodiments herein are generally not limited to any certain shape of microchip.

FIG. 3 schematically show different example microchips relevant for some embodiments herein and how these can be controlled by a magnetic field. More particularly there are 3 microchips 315a-c of "T-shape", each with a wide and a narrow end. The "T-shape" is further exemplified and discussed below. The microchips are each provided with a ferromagnetic layer as discussed above.

Figure 3A:
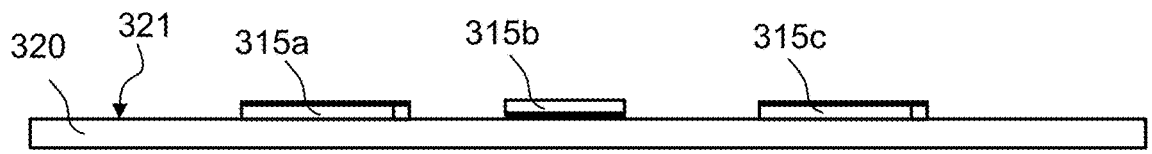
FIG. 3 schematically shows different example microchips relevant for some embodiments herein and how these can be affected and controlled by a magnetic field.

FIG. 3A shows the microchips 315a-c lying flat on a substrate surface 321 of a separate substrate 320, which is the natural position microchips till attain on a horizontal substrate surface due to their inherent planar structure.

Figure 3B:
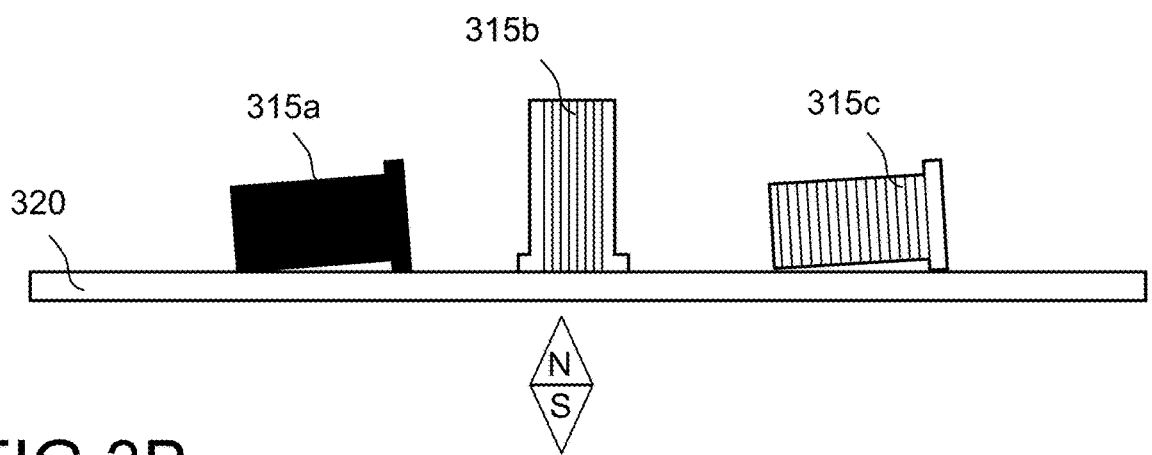

FIG. 3B shows new positions attained by the microchips due to presence of a magnetic field, with field lines (not shown) that passes through the substrate surface 320 substantially perpendicular to it. The field lines have a first polarity as indicated in the figure, in the example with a North (N) direction pointing up and a South (S) direction pointing in the opposite direction, i.e. here down. The magnetic field may be generated by a magnet, e.g. permanent magnet, underneath the substrate. As illustrated, the microchips line up so that the ferromagnetic layer is substantially parallel to the magnetic field lines and thus the microchips 315a-c are perpendicular and vertically oriented in relation to the substrate 320. In the figure, to facilitate understanding, all microchips are in FIG. 3B showing a major surface, e.g. backside, with the ferromagnetic layer. Since the ferromagnetic layers of the microchips of the example are differently designed, the microchips orient differently in the magnetic field. The microchip 315a may orient with any side facing the substrate surface due to poorer orientation control because it has a uniform ferromagnetic layer. The microchip 315b with a striped ferromagnetic layer along its length, line up accordingly in the magnetic field, but has in the shown situation happen to orient with the wide end facing the substrate 320. The microchip 315c with a striped ferromagnetic layer along its with also line up accordingly in the magnetic field, i.e. with the stripes along with the magnetic field.

Figure 3C:
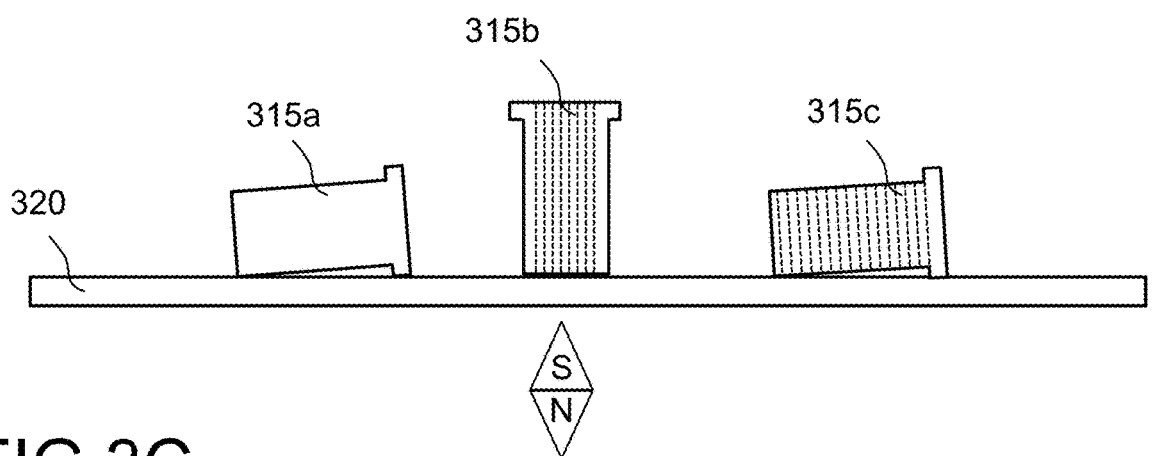

FIG. 3C shows a situation after the polarity of the magnetic field has changed in the situation shown in FIG. 3B, e.g. by flipping a permanent magnet if such is used. As a result, the microchips have flipped on the substrate, i.e. the edge side of each microchip facing the substrate in FIG. 3B is in FIG. 3C instead facing away from it. If the ferromagnetic layer shown in FIG. 3B was on the backside of the microchips, the microchips are in FIG. 3C thus showing their frontside.

Correct reliable lifting directionality of the microchips can thus be accomplished due to a patterned, here striped, ferromagnetic layer, e.g. striped Ni coating on the backside of the microchips. By changing the polarity of a magnet, the microchips can be made to flip, e.g. be turned upside-down. The lifting directionality of microchips can be made independent on the aspect ratios (length/width) of the microchips. By changing the striping direction by e.g. 90°, microchips still lift but with orientation according to the new striping direction. However, microchips with striped ferromagnetic layer can randomly lift "head up" or "head down", which is one of the reasons why a "T-shape" may be preferred or even necessary in some cases. It can be used to allow microchips to be assembled in a receiving substrate only in a desired direction, e.g. "head up".

FIG. 4 schematically show example microchips 415a-c of an example type and how these can be assembled into holes 422a-c of a receiving substrate 420 in accordance with some embodiments herein. The example microchips 415a-c are "T-shaped" and each have a striped ferromagnetic layer along its length, and may e.g. be designed as the microchip 315b above FIGS. 4A-4B show how the microchips are placed on a substrate surface 421 of the separate receiving substrate 410. The placement result in the microchips 415a-c lying flat on the surface 421. The holes 422a-c are in the form of through holes in the substrate surface 421 and are for microchip insertion out-of-plane, here perpendicularly or vertically, in relation to said substrate surface. The holes are matching the shape of the microchips, where each hole only allow the narrow end, and not the wider end, of the "T-shape" to enter.

Figure 4A:
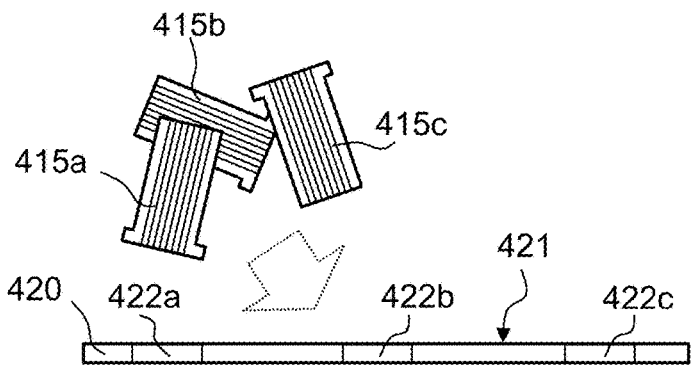
FIG. 4 schematically shows example microchips of an example type and how these can be assembled into holes of a receiving substrate in accordance with some embodiments herein.
Figure 4B:
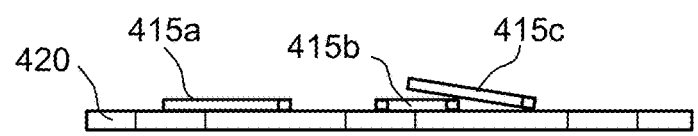
Figure 4C:
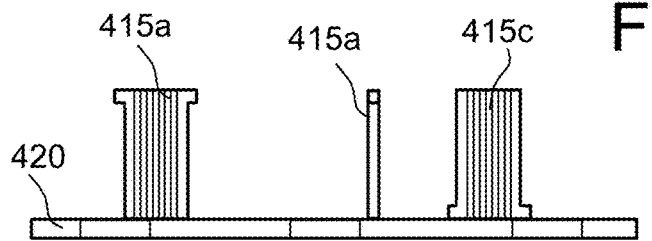
Figure 4C:

FIG. 4C shows a result when a permanent magnet 430 has been placed underneath the substrate, i.e. on the opposite side of where the microchips are placed. Correspondingly as for the situation shown in FIG. 3, the result is that the microchips 415a-c are moved or "lifted" to an upright or "standing" position, i.e. orient themself out-of-plane, here perpendicularly, in relation to the substrate 420 due to how the magnetic field from the magnet affects the ferromagnetic layers of the microchips, as explained above. However, none is located over a hole in a position that allows it to enter. Microchip 415c is also with the wider end facing the substrate so even if it was over a hole, it could not enter.

Figure 4D:
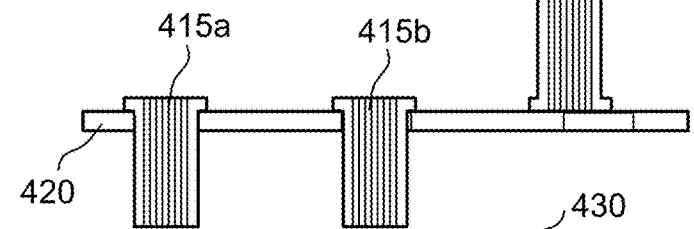
Figure 4D:

FIG. 4D shows a situation after the permanent magnet 430 has moved underneath the substrate in pattern, that may be predefined, e.g. in lines, such as in a zigzag pattern, according to one or more "sweeps", but keeping the same polarity orientation as in FIG. 4C. The microchips 415a-b, that in FIG. 4C was positioned with their narrow ends facing the substrate have, as a result from the application and movement of the magnetic field induced by the moving permanent magnet 430, happened to pass over a hole when they had an orientation that allowed them to enter and be assembled into the hole, e.g. assisted by a magnetic and/or gravity force. In show the example, microchip 415a happened to assemble into hole 422a and microchip 415b into hole 422b. However, microchip 415c could never enter any of the holes 422a-c since it has the wider end facing the substrate 420, which typically is good since that else could mean that the microchip 415c would enter with a non-indented orientation in a hole.

Figure 4E:
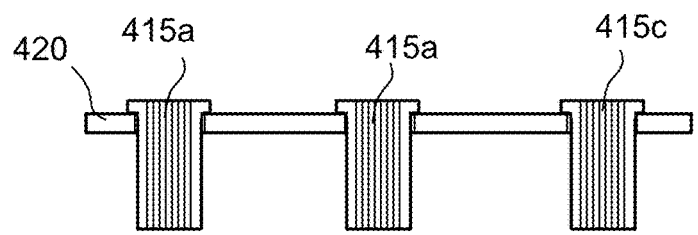
Figure 4E:

FIG. 4E shows a situation after the polarity of the permanent magnet 430 has switched, e.g. the magnet may simply have been flipped around, so that the microchip 415c has flipped orientation as well, and thereby faced the substrate with its narrow end. The microchips 415a-b already assembled into holes, respectively, cannot flip around due to this. After switching the polarity, the magnet 430 was moved in the same or similar pattern again until also the microchip 415c passed over a hole, here hole 422c, with an orientation that allowed it to enter and be assembled into the hole 422c.

Figure 5:
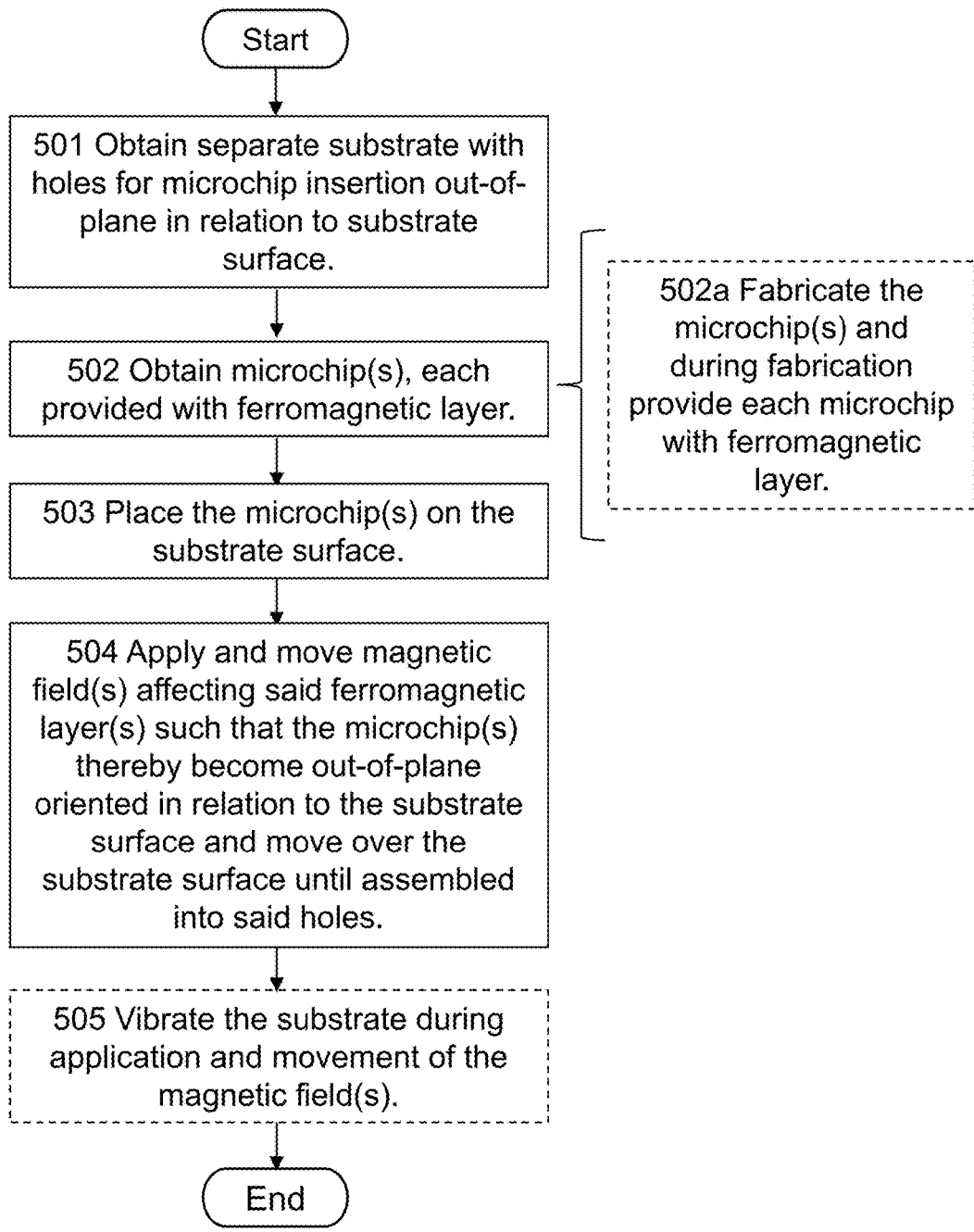
FIG. 5 is a flowchart schematically illustrating embodiments of a method according to embodiments herein.

FIG. 5 is a flowchart schematically illustrating embodiments of a method according to embodiments herein. The method is for assembling one or more microchips, e.g. any one of example microchips presented herein, such as 415, 615, 715, 815, 915 or 1015, into one or more holes, e.g. hole 422 or 722, respectively, in a substrate surface, e.g. 421 or 721, of a separate receiving substrate, e.g. 420, 720, 820, 1020.

As used herein, and as conventionally, a microchip is a piece of planar substrate, which can be typically made of semiconductor, insulating (e.g. glass), metallic or polymeric material, most typically silicon, having integrated by micro-manufacturing methods (e.g. thin-film deposition, lithography, etching, micro-printing, plating, etc.) one or more electrical circuits and/or micro-electro-mechanical system (MEMS) and/or bio-chemical functions and/or purely micro-mechanical functions, typically in at least one of its two opposite major surfaces.

One of the major surfaces, e.g. one with integrated electrical circuits or with a main part of integrated electrical circuits, may be referred to as the frontside and the opposite surface as the backside.

The actions below may be taken in any suitable order and/or be carried out fully or partly overlapping in time when this is possible and suitable.

Action 501

Said substrate is obtained, the holes thereof for microchip insertion out-of-plane in relation to said substrate surface.

Said holes may be through-holes or blind holes, depending on application area and/or purpose of the assembly. A trench is an example of a kind of hole. As realized, the holes should match the microchips, i.e. be matching holes to the microchips.

As used herein, out-of-plane orientation refers to orientation of planes, of planar surfaces or structures, in relation to each other, e.g. a microchip and a substrate with hole for insertion of the microchip. Out-of-plane insertion of the microchip in such hole thus means that the microchip is not in parallel with the surface having the hole when it is inserted into the hole, but inserted with one of its edges or edge surfaces first into the hole, e.g. inserted perpendicular or vertically in relation to the plane of the surface having the hole.

Said holes may be shaped such that each allow only specific microchip orientation or orientations for insertion into the hole. This way it can be facilitated or assured that each microchip assembled into a hole will have a desirable orientation in the hole. In other words, said receiving holes may have shape-matching geometries with a certain orientation or orientations of said microchips. Each hole may thus be of similar or corresponding size and shape as the microchip, at least with regard to a cross-section thereof. The shape of each hole may allow only a specific microchip orientation.

Action 502

Said one or more microchips are obtained, each provided with a ferromagnetic layer, e.g. 213 or 613, of ferromagnetic material.

The ferromagnetic layer may correspond to a coating, e.g. applied such as deposited, during fabrication of the microchip. The ferromagnetic layer is typically provided parallel with the two major surfaces of the microchip and may be on one of the major surfaces of the microchip, e.g. the backside of the microchip, or may be a core layer, i.e. internal layer.

Said ferromagnetic layer should be provided to support assembly and preferably not be involved in operative function of the microchip i.e. the ferromagnetic layer is preferably excluded from participating in any operative function of the microchip. In other words, said microchips have an operative function and said ferromagnetic layer should be provided separate from this operative function. The ferromagnetic layer may thus be provided independent from the operative function and solely to accomplish said magnetic assembly. The microchip should thus be operative also without the ferromagnetic layer. The microchip without the ferromagnetic layer may not be magnetic at all, at least not sufficient to accomplish the magnetic assembly. As should be realized, the operative function is the function that the microchip is designed provide when it is being operated post-assembly, e.g. as part of a device.

Each of said microchips may typically have a thickness up to 1000 μm, a width up to 4000 μm and/or a length up to 2000 μm.

Further, each of said microchips may typically have a thickness that is at least 40 μm, a width that is at least 200 μm and/or a length that is at least 200 μm. Narrower microchips (FIG. 10) are also well compatible with the described method and embodiments herein.

As used herein, length of a microchip is used to denote the dimension of the microchip in direction of intended insertion into the hole for assembly and width being the orthogonal direction to this. In other words, length may in some embodiments be less than the width.

Said ferromagnetic layer may have a thickness between 500 nm and 100 μm, preferably between 1 μm and 5 μm.

Said ferromagnetic layer is advantageously patterned in one or more straight stripes with an orientation to result in directional lifting along said one or more stripes during said application of the magnetic field and thereby cause said out-of-plane orientation. This way improved control of said out-of-plane orientation can be accomplished, enabling making the microchips orient on the substrate in a way that facilitate assembly into the holes. Different geometry, patterning and thickness of the ferromagnetic layer affect response to the magnetic field, such as motion, re-orientation and/or vertical lifting. In practice different configurations of geometry, patterning and thickness of the ferromagnetic layer, and e.g. also the magnetic field, may be tested for a microchip to be assembled based on embodiments herein to find a configuration that facilitate assembly. Then ferromagnetic layers and/or magnetic field according to such configuration may be applied and used for subsequent assembly, e.g. in production of a device comprising the assembled microchips. A patterned ferromagnetic layer on a microchip may e.g. be realized using a laser, photolithography, shadow masking, or transfer of and attaching a ferromagnetic layer having the pattern on the microchip.

For example, by striping the ferromagnetic layer, e.g. Ni layer, of a microchip, e.g. with a laser or using photolithography, the magnetic response of the microchip in a magnetic field then results in directional lifting along said stripes, and thus provide directionality.

In some embodiments, said stripes are multiple stripes that are parallel to each other.

Said microchips may have a wide end that is wider than an opposite, thus narrow, end, and wherein the holes are shaped such that each allow only the narrow end of the microchip to enter the hole. That is, each microchip may be "T-shaped". This way it can be assured that when vertically oriented, only the desirable end of each microchip can and will enter the hole. The wider end of the T-shape will rest on the substate at the edges of the hole. This is advantageously combined with said striping of the ferromagnetic layer for controlling the microchip orientation for assembly in to the holes. Further advantages with the T-shape is that it can be used to prevent that a vertically assembled microchip will rest on a bottom of the hole when the hole is a blind hole, or make sure that it does not fall through the hole when the hole is a through hole.

In other words, the "T-shape" may allow assembly of the microchips with only one orientation and to mechanically prevent the microchips to rest on the bottom and/or fall through matching receiving holes. "T-shaped" microchip in a general meaning may refer to that a microchip have a wider top than bottom and/or body.

The ferromagnetic material may be Ni, such as a deposited Ni layer, or any other ferromagnetic metal or metal alloy, e.g. Al, Gd, W, Co, Fe, Co2FeAl, FeCo. That is, the ferromagnetic layer, e.g. a Ni layer may be deposited on microchips to provide magnetic responsivity.

The ferromagnetic layer, e.g. its geometry, patterning and thickness, may be designed to providing different types of responsivity to the presence of, and in relation to, the magnetic field(s), e.g. to accomplish a desirable motion and/or re-orientation and/or vertical lifting.

Said ferromagnetic layer, e.g. coating, may thus be patterned in stripes so that the magnetic response of the microchip in said magnetic field(s) results in directional lifting along said stripes, and thus provide directionality of the assembly.

Action 502a

In some embodiments, Action 502 comprises that the microchips are fabricated and that each microchip during the fabrication is provided with said ferromagnetic layer.

Action 503

The microchips are placed on said substrate surface.

The placement may involve placing the microchips lying flat on the surface.

This action may correspond to what is shown in FIGS. 4A-B.

Action 504

It is applied and moved one or more magnetic fields affecting said ferromagnetic layer of each microchip such that the microchips thereby become out-of-plane oriented in relation to said substrate surface and move over the substrate surface until assembled into said holes.

Said application and movement of the magnetic field may be caused by one or more permanent magnets underneath said substrate, i.e. on the other side in relation to the surface on which the microchips are placed. This offers a robust and simple generation of the magnetic field. However, an alternative is of course to generate magnetic fields electrically. The magnetic field(s) may thus be moved by a moving permanent magnet underneath said receiving substrate. A series of magnets and/or more complex applied magnetic field profiles may be used. The permanent magnet(s) my e.g. be single or alternated-domains magnets.

Said application and movement of said one or more magnetic fields may include switching polarity of the magnetic fields.

Said out-of-plane orientation may be perpendicular to said substrate surface. E.g. vertically oriented in relation to said surface. As realized by the skilled person, in a practical application, perpendicular and vertical orientation of the microchips include some deviation from an theoretical and exact perpendicular or vertical orientation. The skilled person has the ability to realize if a microchip in a practical application is considered assembled with a perpendicular orientation or not in relation to the substrate.

This action may correspond to what is shown in FIGS. 4C-E.

Action 505

The separate substrate may be vibrated during said application and movement of the magnetic field to reduce friction and thereby facilitate the move of the microchips over the substrate surface.

In other words, said separate substrate may be subject to vibration to reduce friction between the substrate and said microchips.

In some embodiments, the ferromagnetic layer is a thin-film Ni layer deposited on the backside of the microchips, there is striping of the Ni layer to provide directionality of the lifting in the magnetic field(s), the microchips have a "T"-shape that mechanically controls how the microchips can enter the holes. The "T" shape also allows the chip to rest and be sustained by the substrate and not by their bottom, or end inserted into the hole, i.e. the bottom or end can be free and even stand out from the backside of the receiving substrate.

Thanks to embodiments described herein, such as above in relation FIG. 5, contact-less control and motion of microchips on surfaces is enabled for out-of-plane assembly into holes in the surface. The method is versatile, can be applied without affecting functionality of the microchips or the device they are part of when assembled. It further allow for successive electrical contacting of said chips. It is contact less and suitable to deal with small and fragile microchips.

The method can be applied for several different application devices, e.g. to provide inductors, RF antennas, optical attenuators, and flow sensors, but is particularly suited to assemble e.g. microprobes, separately fabricated with standard planar silicon microfabrication techniques, in hollow microneedles. This is exemplified further below.

FIG. 6 schematically show an example of how an example microchip relevant for some embodiments can be fabricated.

FIG. 6A illustrates a thermally oxidized silicon wafer 641, i.e. a Si wafer with a top oxide layer. FIG. 6B illustrates how trenches 643a defining the microchips' perimeters have been formed, e.g. with Si Deep Reactive Ion Etching (DRIE), and where a second thermal oxidation step has been performed to electrically insulate the microchip sidewalls. In FIG. 6C electrodes and resistor lines, e.g. of AU, have been deposited using e.g. e-beam evaporation. In FIG. 6D Si DRIE have been performed on the backside to define the microchip thickness and a ferromagnetic layer, e.g. Ni layer, has been deposited on the backside, e.g. a uniform ferromagnetic layer 613a. In FIG. 6E, the deposited ferromagnetic layer has been laser patterned resulting in a patterned ferromagnetic layer 613b and the microchip has been released from the wafer by breaking the silicon tabs along their perimeter.

A separate substrate with receiving holes for microchips, e.g. as fabricated a s described in relation to FIG. 6 may be fabricated in a similar process. For example by first thermally oxidizing a silicon wafer. Holes may then be formed using Si DRIE, e.g. through holes, for matching the microchip geometries. Then the wafer may again be thermally oxidized. Thereafter contact pads, or bond pads, e.g. Au bond pads, may be deposited on the wafer frontside close to each hole.

To realize microchips, e.g. in fabrication described in relation to FIG. 6, a 100-mm-diameter, 300-μm-thick Si wafer was used. The wafer was thermally oxidized and the SiO2 layer was used as hard mask in steps as described in FIG. 6A-E. 70-µm-deep silicon trenches were etched in the wafer frontside using DRIE, after oxide patterning, to form both the perimeters of the microchips and sidewall trenches for wire bonding. Four small silicon tabs were kept intact along the perimeter in order to mechanically connect the microchips to the wafer and provide sufficient robustness for remaining fabrication steps. A second thermal oxidation was performed to ensure electrical insulation of the silicon trenches around the microchips. 100-nm-thick Au electrodes and resistors were then deposited by evaporation, over a 20-nm-thick Ti adhesion layer, and patterned using lift-off photolithography. Then, a backside lithographic step was performed and the SiO2 was selectively etched using RIE, followed by another Si DRIE step to form recesses matching the frontside structures and define the final microchip thickness (70 µm). Finally, a 3-um-thick Ni layer was deposited via sputtering on the backside of the wafer. A femtosecond laser (Spirit, Spectra-Physics, MKS Instruments, USA) was used to pattern the Ni layer to assist magnetic assembly, and to release the microchips from the wafer, by ablating four supporting Si tabs and the remaining materials present on the bottom SiO2 layer surrounding the microchip perimeter. The femtosecond laser parameter used for the Ni patterning were: λ=520 nm, pulse repetition rate=4 kHz, movement speed=400 µm/s, 0.25 NA for the focusing objective, airflow during operation to remove micro-debris, 20 µm of line pitch, and 1.88 mW average power before the objective. For releasing the microchip by cracking the silicon tabs: λ=520 nm, pulse repetition rate=1 kHz, movement speed~2 µm/s, and 16.8 mW average power before the objective. The tabs ablation process was performed under water to avoid re-deposition of small particles and heat accumulation, and to simplify the collection of the released microchips. Alternatively, microchips were also released in parallel in water using ultra-sonication. Ultra-sonication was able to crack the oxide layer and, at increased power, also to selectively break the Si tabs at locations where the tabs were previously indented by the laser machining. Depending on the fragility of the realized microchips and the sensitivity of the device surfaces of the specific application, the direct laser release could be preferable as compared to the faster but less gentle ultra-sonication method. Additionally, if desirable, the use of laser could be for example substituted by the use of a shadow mask or a dry-film resist, for the Ni layer patterning, and by dicing, for the microchip release.

To realize a separate receiving substrate, a 100-mm-diameter, 500-µm-thick Si wafer was thermally oxidized to create a top insulation layer. Then, the SiO2 layer was selectively etched by RIE, and through-holes were formed using DRIE. The through-silicon holes were then thermally oxidized to avoid unwanted electrical contacts between the receiving substrate and the assembled microchips. Finally, to create the three bond pads near each hole on the frontside of the wafer, a 60-nm/300-nm-thick TiW/Au layer was sputtered on the substrate and patterned using lift-off photolithography.

Magnetic assembly experiments were conducted on the fabricated 500-µm-thick silicon receiving substrate with rectangular through-holes. The receiving substrate was placed at the bottom of a glass petri dish for the duration of the experiments. Microchips with striped Ni coating on the backside were spread over the receiving substrate. A permanent neodymium magnet (N48, nominal residual magnetism of 1.37-1.42 T, rod-shaped with a diameter of 6 mm) was then placed under the petri dish to induce vertical lifting of the microchips. The receiving holes were located 1 mm apart from each other (center-to-center) and arranged into separate arrays. The holes had a 25 µm gap on each side between the sidewall of the holes and the assembled microchips. The arrays of holes used in the magnetic assembly experiments contained one, two, three, four, or six holes in line. The holes in each array were arranged in a line with short sides of the rectangular holes facing each other. The reason to choose in-line arrays was to guarantee a better statistical coherence, since the group of microchips was confined by the magnetic field in an area smaller than the inter-row distance. As a consequence, with the specific magnet used and the magnet motion characteristics described below, a magnetic sweep on an in-line array (e.g. 1×4) can statistically be considered equivalent to a sweep on the different lines of the 2-D array with the same total number of holes (e.g. 2×2) moving back and forth. For each array size, the assembly test was repeated fifty times, using the same number of microchips (39 microchips) with the same dimensions (500 µm top width, 25 µm gap between the microchip and the matching receiving hole). The magnet was manually moved back and forth along the long edges of the rectangular holes. After each sweep of the magnet over the array, the array was visually observed for any newly filled holes. Disassembly of an already filled hole was a very rare event only observed a few times during the whole experimental process. Each array was completely filled 50 times while the number of sweeps to fill each hole in an array was recorded.

Data from the assembly experiments was collected and processed to represent the number of magnet sweeps needed to fill the next hole after a previous hole was filled. Each step of filling of an array, being it the filling of the first hole or filling the last hole of the array, followed an exponential probability distribution and was modelled accordingly. The fitting parameter for the exponential distribution is the mean number of magnet sweeps m to fill an individual hole. Thus, the probability density function $f(x)$ of such a distribution can be expressed using the following equation:

$$f(x) = \frac{1}{m} e^{-\frac{x}{m}} \quad \text{(Eq. 1)}$$

where x stands for the variable, i.e. the number of magnet sweeps. A hypoexponential distribution represents a series of exponentially distributed events and is thus suitable for modelling the stochastic process of completely filling an array. The information gathered from the exponential distributions was used to create the corresponding hypoexponential distributions. The resulting probability density function $f(x)$ of the modeled hypoexponential distribution can be expressed using the following equation:

$$f(x) = \sum_{i=1}^{k} \frac{1}{m_i} e^{-\frac{x}{m_i}} \left( \prod_{j=1, j\neq i}^{k} \frac{\frac{1}{m_j}}{\frac{1}{m_j} - \frac{1}{m_i}} \right) \quad \text{(Eq. 2)}$$

where $m_i$ represents the mean number of magnet sweeps to fill the $i^{th}$ hole in the studied array of k holes. These hypoexponential distributions matched well with the data representing the probability distributions of completely filling holes arrays of different sizes.

FIG. 7 schematically shows an example relating to application of the method discussed in relation to FIG. 5. To verify the viability of vertical magnetic assembly according to embodiments herein, a demonstrator consisting of arrays of 4×4 microchips, as illustrated in the figure was realized based on fabrication as described in relation to FIG. 6. The magnetic assembly was of discrete microchips, all similar, into rectangular through holes in the receiving substrate. Also, although not discussed in detail herein, subsequent edge wire bonding was performed thereafter to create reliable chip-to-substrate electrical interconnections. Thanks to this and embodiments herein, the receiving substrate and the microchips can be separately fabricated using standard in-plane silicon microfabrication technologies and be subsequently integrated.

Figure 7A:
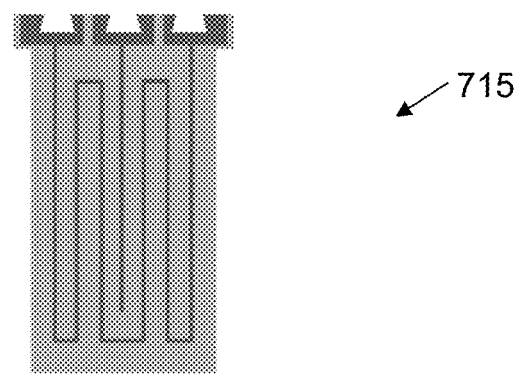
FIG. 7 schematically shows an example from application of the method disclosed in relation to FIG. 5.

Each of said microchip had a design corresponding to a microchip 715 as shown in FIG. 7A where the frontside is shown. The backside (not shown in FIG. 7A) had a patterned ferromagnetic layer as described herein, with stripes along the length of the microchip. Hence, to perform the magnetic field-assisted assembly, a thin layer of Ni was deposited and patterned on the backside of the microchips, thus enabling controlled vertical lifting and handling of the chips upon the presence of an external magnetic field.

Figure 7B:
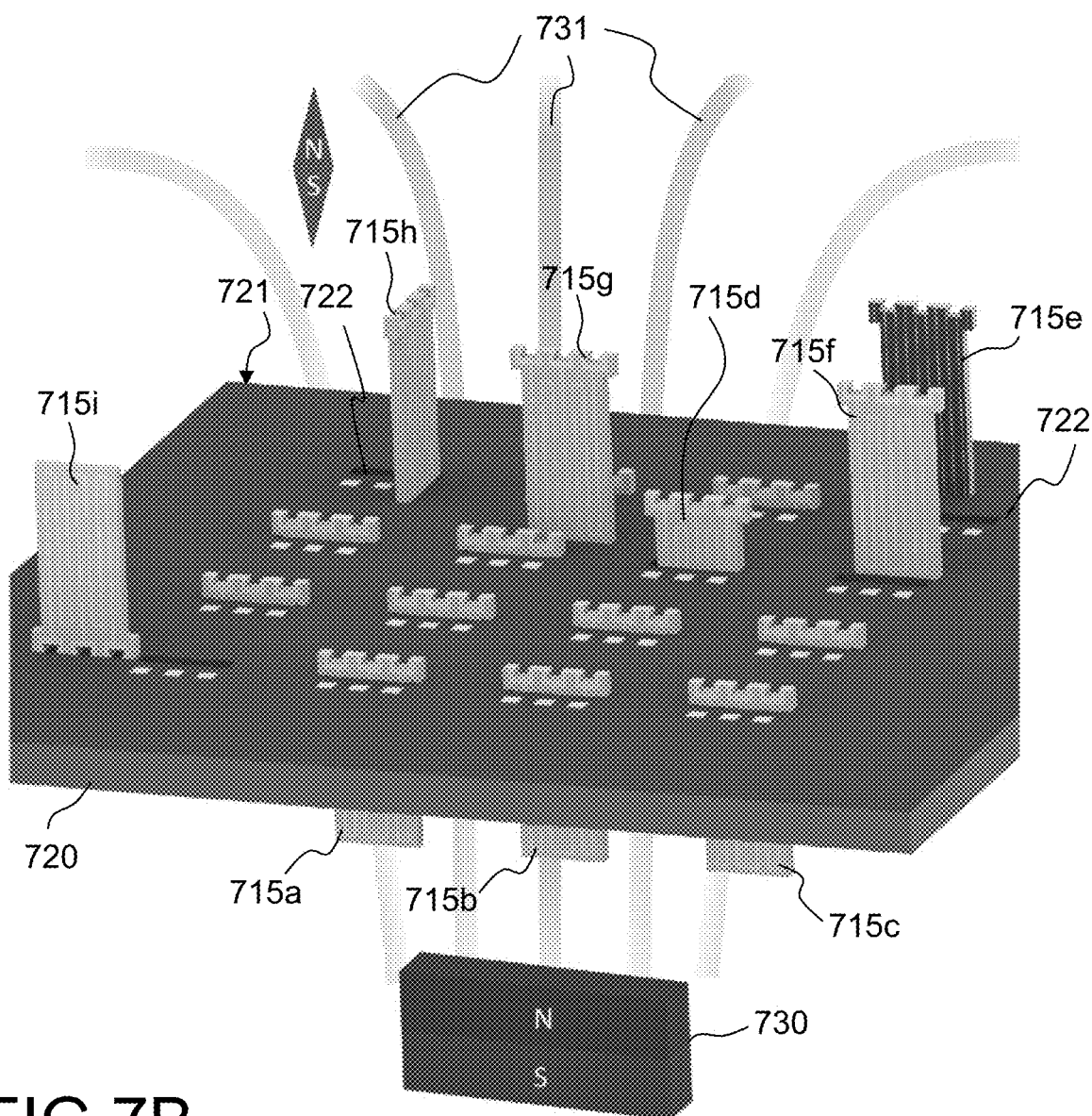

After the microchips 715 were released and collected from their source wafer, they were placed on top of a receiving substrate 720, i.e. on a surface 721 thereof, containing matching holes and bond pads. To perform the assembly, a permanent magnet 730 was placed and moved below the receiving substrate 720, thus inducing lift and motion of the microchips 715 on the surface until the microchips eventually fell into the receiving holes, with their frontside or backside facing the bond pads. FIG. 7B shows a situation after a while when some microchips have assembled into holes. Some have not yet done so. For example, microchips 715a, 715b, and 715c examples of microchips that have assembled into hole, microchip 715d is on its way to enter a hole, while microchips 715e, 715f, and 715i are still located on the surface 721 in an upright position thanks to the magnetic field 731 produced by the permanent magnet 730 and the ferromagnetic layers of the microchips. By continued movement of the permanent magnet, e.g. in straight lines in a zigzag like pattern, all microchips will eventually enter a hole.

As realized from the figure, and as already y indicated above, the "T"-shape of the microchips, i.e. a main rectangular body and a slightly wider over-hanging top, ensures that the microchips 715 fall into the holes with a correct vertical orientation. The wider top part, where the frontside electrodes are located, thereby remains outside of the holes, because of its size. The realization of this "T" shape consumes additional wafer area compared to rectangular microchips, e.g. in the order of 10% for the geometry used for the realized microchips. In general, the larger the microchips the smaller is the additional percentage of silicon area required. Nonetheless, at the same time, it does not add any fabrication step with respect to the same process to create rectangular microchips and, thus, it does not practically increase the system complexity.

In the realized example, the stripe patterning of the ferromagnetic, e.g. Ni, layer led to reliable vertical lifting along the striping direction. As already indicated above, microchips with only a uniform Ni layer lift in different directions depending on the microchips' aspect ratio and their initial orientation in relation to the magnetic field. Using striped Ni, the lifting direction has through experiments shown to be controllable for a range of microchip sizes and aspect ratios, and it is expected that striped ferromagnetic layer could accomplish directional lifting and orientation of microchips in principle independent on aspect ratio (length vs width), and at least for all conventional microchip sizes.

Moreover, as further realized from this and example above, the "T" shape of the microchips prevented them from being assembled upside down into the receiving holes. Thus, the combination of striped ferromagnetic layer, application of the magnetic field, the T-shape, and in this example also the microchip matching rectangular shape of the holes, resulted in control of the microchips' orientation such that desirable assembly into holes was achieved for all microchips, without having to mechanically contact the microchips, and without having to involve any harsh or unconventional steps or materials during fabrication or assembly.

Magnetic assembly relating to embodiments herein can be seen as a stochastic process. To investigate the behaviour, statistical analysis was performed on the assembly efficiency. In experiments relating to this, five different sizes of receiving-hole arrays, with up to six holes placed in line and were magnetically filled 50 times each. In each test, the number of microchips used was 39, significantly larger than the number of holes, to guarantee a better and stable efficiency throughout the assembly process. The magnet was manually moved back and forth along the long edges of the rectangular holes. This movement direction allowed disassembly of chips that had not completely slid into the holes for example due to being upside down. The number of movements of the magnet from one side of an array to the other (hereafter called magnet sweep) needed to fill each hole in an array was recorded. It was found that the probability density of filling a single-hole array was exponentially distributed. The same distribution has been reported also for other self-assembly processes. When assembling larger arrays, each progressive step of successfully filling a hole in an array follows an exponential distribution. The mean number of magnet sweeps needed for each successful single-hole assembly event, scaled with the number of remaining empty holes, is larger for the first assembly event in all the array sizes, but the mean was found to then converge to a stable lower value. This was due to fact that the number of chips was significantly larger than the number of holes to be filled, keeping constant the probability of an assembly event throughout the assembly process. The difference between the first assembly event and the rest of the events is explained by the increased number of microchip rotations caused by the protruding top parts of already assembled microchips.

Further, it was found that magnetic assembly can be scaled to large arrays without prohibitive time delays. The mean numbers of magnet sweeps reported in conducted experiments were used as fitting parameters for hypoexponential distributions that describe the probability densities of completely filling arrays of different sizes, in contrast to filling just a single hole in an array. The modes of the probability densities move right with increasing array sizes. Hypoexponential distributions together with the experimentally observed completion times for all the array sizes were obtained. Hypoexponential distributions can also be used for creating forecasts for the assembly of even larger arrays. A worst-case scenario with the largest mean number of magnet sweeps observed in the experiments was selected for making the forecasts. The forecasted probabilities of achieving a completely filled array asymptotically approached 100% after a relatively low number of magnet sweeps, even for larger arrays. For example, an array of 1000 holes would be completely filled with 99.8% probability after only 180 magnet sweeps. To guarantee statistical consistency, due to the manual nature of the magnet motion, measurements may be provided in terms of number of magnet sweeps instead of time. Each manual sweep took a maximum of 2 seconds during the tests. For example, on average, an array of six holes could thus indicatively be assembled within 2.5 minutes. The assembly speed could possibly be further increased by using a robotic assembly setup and by using multiple magnets in parallel for larger-scale assembly. In particular, to upscale to large 2-D arrays, several magnets can be positioned in arrays underneath the receiving substrate. Each magnet would be responsible to move a separate group of microchips on the surface thus enabling parallelization of the assembly process without substantial time increase. Moreover, the process reported here is stochastic, i.e. no active aid was used unlike cases where for example software is responsible to address the chips to the remaining empty holes and improve the resulting assembly efficiency The assembly efficiency is affected by the range of microchip's rotational freedom when falling into the hole itself. The rotational freedom can be defined as the range of angles that the microchip can have while still fitting into the receiving hole, as a result of the relative size of the microchip in comparison to the hole. As a consequence, and as expected, narrower microchips and larger gaps were shown to improve the assembly efficiency accordingly. In particular, in the case of a circular hole, the mean number of sweeps to fill the hole would be drastically reduced, between 1.6 and 1.9 sweeps, which correlates well with earlier results obtained when assembling circular Ni rods into circular holes. Notably, in this situation the expected time for filling a six-hole array would potentially drop to only 4 seconds. Faster assembly into circular holes might be preferable in certain applications. A circular receiving hole could thus significantly increase the assembly efficiency. However, for applications where the rotational positions of assembled microchips are important, rectangular holes serve a role for aligning the microchips and, additionally, can save area on the receiving substrate. Further, based on other, previous studies on assembly of micro- and nano-components a positive contribution to the assembly efficiency can be expected by using funnelled receiving holes or template aids. This could potentially beneficially affect the assembly also here for microchips, even though the effect may be expected to be less significant here, due to the directional lifting provided by the patterned ferromagnetic layer and if there is need for a sufficient mechanical contact area between the hanging part of the microchip and the receiving substrate.

Figure 8:
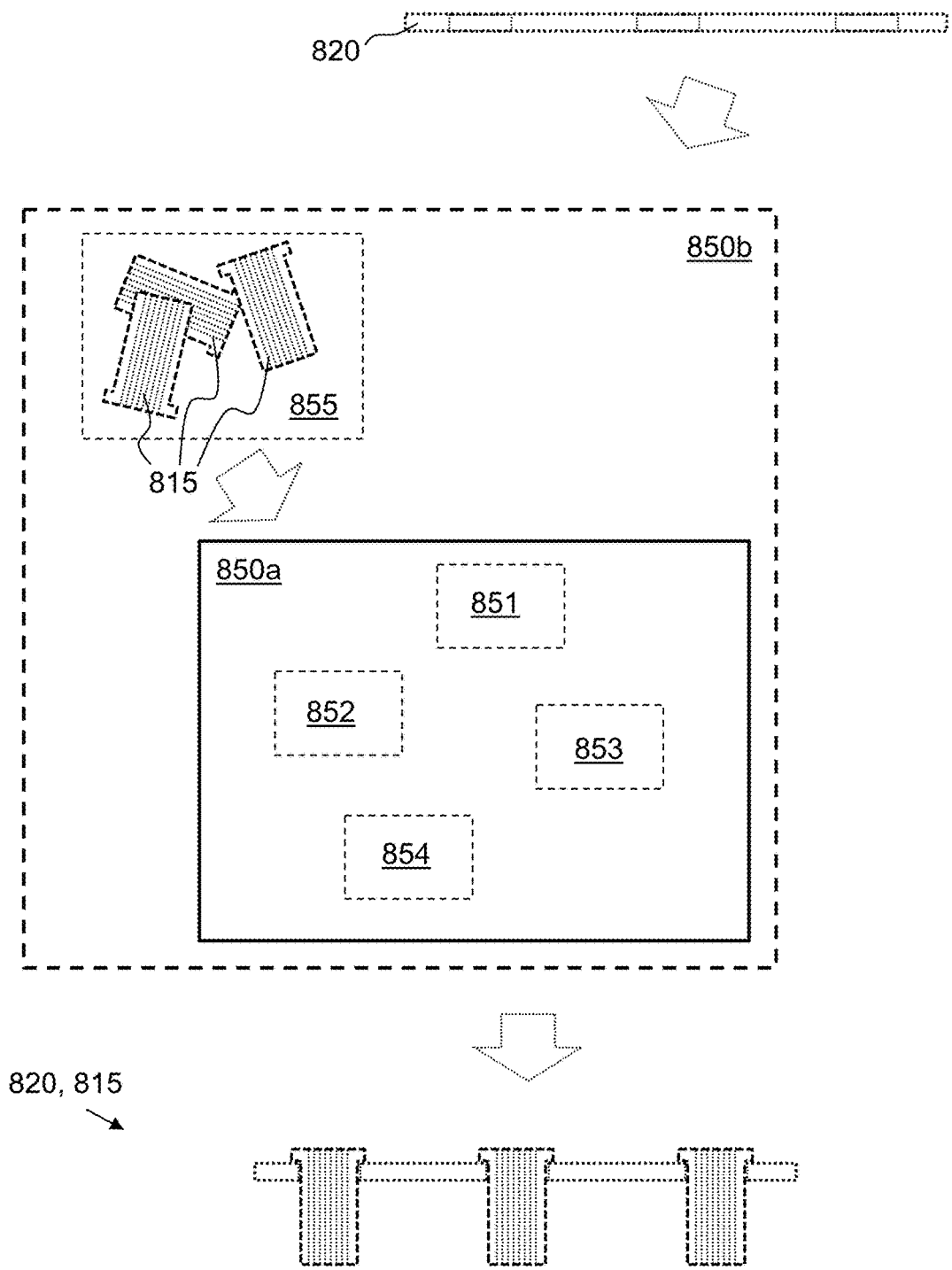
FIG. 8 is a schematic block diagram for illustrating embodiments of how a microchip assembly arrangement may be configured to perform the method and actions disclosed in relation to FIG. 5.
Figure 9A:
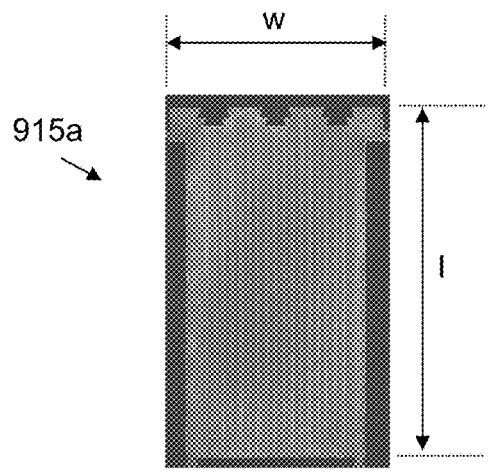
FIG. 9 show photos of different example microchips relevant for some embodiments herein, which have been fabricated and tested.
Figure 9B:
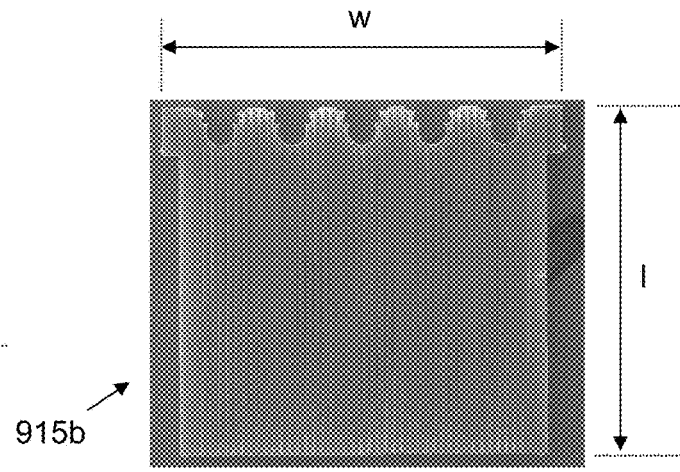
Figure 9C:
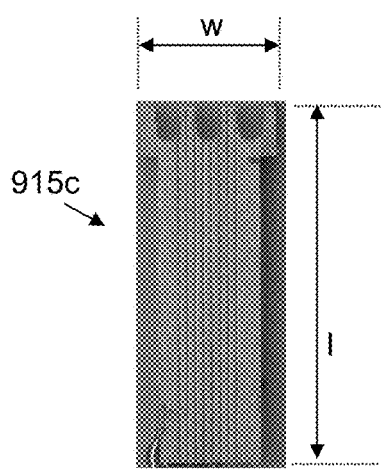
Figure 9D:
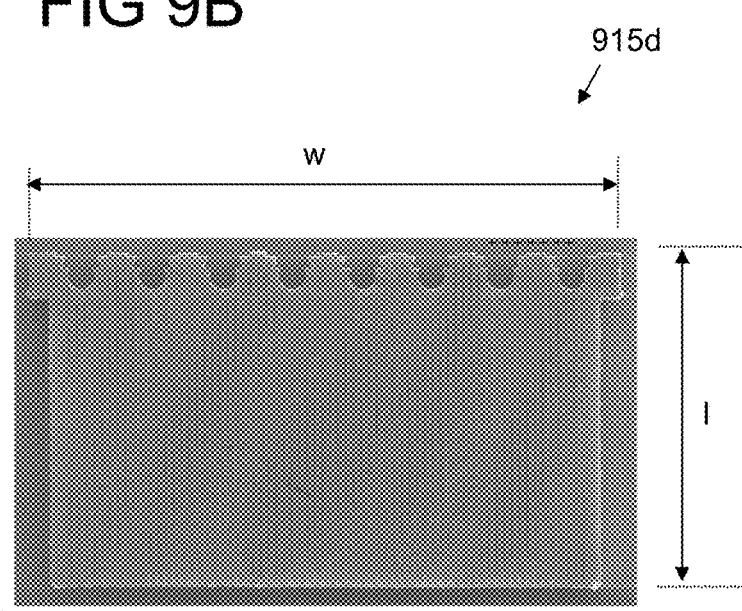
Figure 9E:
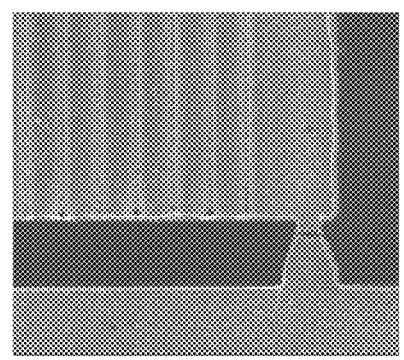

FIG. 8 is a schematic block diagram for illustrating embodiments of how a microchip assembly arrangement 850a or 850b may be configured to perform the method and actions discussed in relation to FIG. 5.

Hence, the microchip assembly arrangement is for assembling one or more microchips, e.g. any one of example microchips presented herein, such as 415, 615, 715, 815, 915 or 1015, into one or more holes, e.g. hole 422 or 722, respectively, in a substrate surface, e.g. 421 or 721, of a separate receiving substrate, e.g. 420, 720, 820, 1020.

In some embodiments, the microchip assembly arrangement comprises one or more of an obtaining module(s) 851, placing module(s) 852, applying and moving module(s) 853, vibrating module(s) 854, fabrication modules 855 as exemplifying hardware and/or software module(s) for carrying out actions of embodiments herein.

Hence:

The microchip assembly arrangement and/or the obtaining module(s) 851 is operative, or configured, to obtain said substrate.

The microchip assembly arrangement and/or the obtaining module(s) 851 is operative, or configured, to obtain said microchips, each provided with said ferromagnetic layer of ferromagnetic material. In some embodiments this comprises that the microchip assembly arrangement and/or the obtaining module(s) 851 and/or the fabrication module(s) 855 is configured to, during fabrication of said microchips, provide each microchip with said ferromagnetic layer.

The microchip assembly arrangement and/or the placing module(s) 852 is operative, or configured, to place the microchips on said substrate surface.

The microchip assembly arrangement and/or the applying and moving module(s) 853 is operative, or configured, to apply and move said one or more magnetic fields affecting said ferromagnetic layer of each microchip such that the microchips thereby become out-of-plane oriented in relation to said substrate surface and move over the substrate surface until assembled into said holes.

Further, the microchip assembly arrangement, and/or the vibrating module(s) 854 may be operative, or configured, to vibrate the substrate during said application and movement of the magnetic field to reduce friction and thereby facilitate the move of the microchips over the substrate surface.

FIG. 9 show photos from a scanning electron microscope (SEM) of different example microchips relevant for some embodiments herein and that have been fabricated and tested. The shown SEM images are of the backside of the different microchip geometries that have been fabricated and studied, having the same length 1 (750 µm) but different widths w. The chip aspect ratios here range from 2.3 to 0.5 (length/width). FIG. 9A shows a 500-µm-wide microchip 915a, FIG. 9B a 1000-µm-wide microchip 915b, FIG. 9C a 330-µm-wide microchip 915c, and FIG. 9D a 1500-µm-wide microchip 915d. Further, FIG. 9E shows an enlarged view of Ni striping of a 500-µm-wide microchip as in FIG. 9A, where also silicon tabs that were used during the fabrication process to keep each microchip attached to the silicon wafer and that eventually is cracked to release the microchip.

Figure 10A:
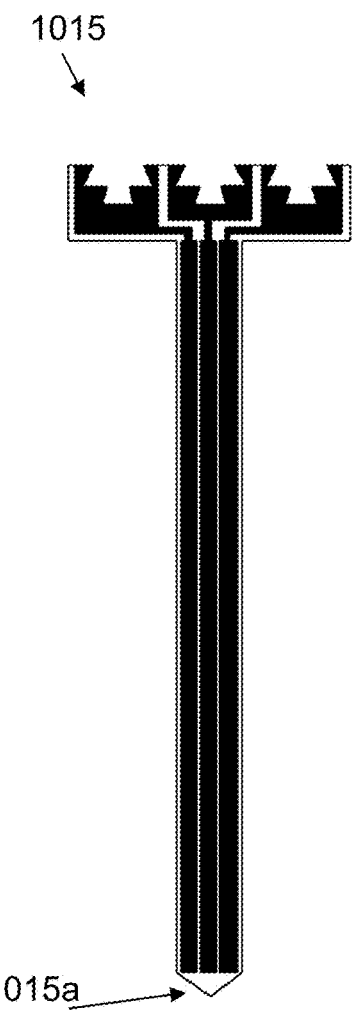
FIG. 10A schematically shows an example microchip relevant for some embodiments herein.
Figure 10B:
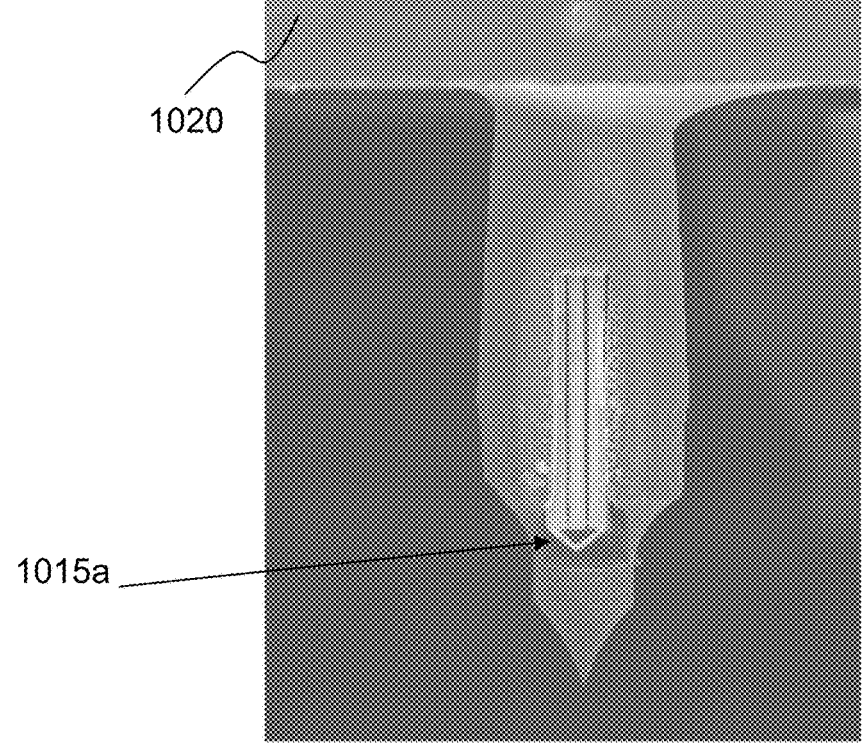
FIG. 10B shows a photo of a realization of the example microchip of FIG. 10A assembled into a substrate for an application supported by embodiments herein.

FIG. 10 relate to an example microchip 1015 and how it can be realized and used in an application supported by embodiments herein, viz. a three-electrode sensor microprobe that can fit inside the lumen of a hollow silicon microneedle. FIG. 10A schematically shows the example microchip 1015, i.e. corresponding to said microprobe, an lower end 1015 thereof indicated by an arrow. Black indicates conducting material and the three electrodes are visible. Hence, the frontside is shown in FIG. 10A. The backside has a patterned ferromagnetic layer similar as in example discussed above. FIG. 10B shows a SEM photo of a demonstrator microprobe corresponding to a realization of the example microchip 1015 assembled in a hole of a substrate 1020, the substrate and hole corresponding to said hollow silicon microneedle. The width of such an example of a microprobe was ~65 µm. To facilitate identification, the lower end 1015a is indicated also in FIG. 10B. The figure also show the microprobe electrically connected using edge wire bonding.

The example of FIG. 10 demonstrate a situation where embodiments herein may be particularly useful, for applications involving integration of out-of-plane, e.g. vertically, oriented microchips that are extremely fragile. The microchip 1015 has the same thickness and length as the previously presented microchips, but a narrower body, a 65-µm-wide probe, and a narrower 280-µm-wide top part of the "T"

shape. In particular, the realized microprobe here represents a miniaturized sensor, similar to enzymatic biosensors developed in previous work and designed to fit in a microneedle lumen. Sensing microprobes as in this application typically require assembly and electrical contacting in which many requirements and restrictions simultaneously apply. For example, they consist of sub-mm-sized microchips, too tiny and fragile to be mechanically handled, that need to be assembled with a certain orientation and might suffer the presence of materials that can either interfere with their operation or dramatically increase their fabrication complexity. Moreover, biosensors are extremely sensitive after the deposition of enzymatic membranes on the electrodes. In fact, while the silicon-based probes can be processed with standard microfabrication techniques, after the functionalization they cannot be exposed to solvent treatments and require room temperature handling to preserve their functionality. Despite the fragility of such miniaturized devices, the microchips were intact after application of embodiments herein and wire bonding, demonstrating the applicability and further miniaturization possibility based on embodiments herein.

This is an example in which embodiments herein may be of use even with a sparse array of receiving holes, because of the impracticality to mechanically handle and contact such tiny and fragile devices.

Please note that any enumerating terminology used herein, such as first device, second device, etc., should as such be considered non-limiting and the terminology as such does not imply a certain hierarchical relation. Without any explicit information in the contrary, naming by enumeration should be considered merely a way of accomplishing different names.

As used herein, the expression "configured to" may e.g. mean that a processing circuit is configured to, or adapted to, by means of software or hardware configuration, perform one or more of the actions described herein.

As used herein, the terms "number" or "value" may refer to any kind of digit, such as binary, real, imaginary or rational number or the like. Moreover, "number" or "value" may be one or more characters, such as a letter or a string of letters. Also, "number" or "value" may be represented by a bit string.

As used herein, the expression "may" and "in some embodiments" has typically been used to indicate that the features described may be combined with any other embodiment disclosed herein.

In the drawings, features that may be present in only some embodiments are typically drawn using dotted or dashed lines.

When using the word "comprise" or "comprising" it shall be interpreted as nonlimiting, i.e. meaning "consist at least of".

The embodiments herein are not limited to the above described preferred embodiments. Various alternatives, modifications and equivalents may be used. Therefore, the above embodiments should not be taken as limiting the scope of the present disclosure, which is defined by the appending claims.

The invention claimed is:

1. A method for assembling one or more microchips into one or more holes, respectively, in a substrate surface of a separate receiving substrate, wherein said method comprises:
obtaining the substrate, the holes thereof for microchip insertion out-of-plane in relation to said substrate surface;
obtaining said microchips, each provided with a ferromagnetic layer of ferromagnetic material;
placing the microchips on said substrate surface; and
applying and moving one or more magnetic fields affecting said ferromagnetic layer of each microchip such that the microchips become out-of-plane oriented in relation to said substrate surface and move over the substrate surface until assembled into said holes, and
wherein in said ferromagnetic layer is patterned in one or more straight stripes with an orientation to result in directional lifting along said one or more stripes during said application of the magnetic field and cause said out-of-plane orientation.

2. The method as claimed in claim 1, wherein said obtaining of the microchips comprises fabricating said microchips and during the fabrication providing each microchip with said ferromagnetic layer.

3. The method as claimed in claim 1, wherein each of said microchips have a thickness up to 1000 µm, a width up to 4000 µm and/or a length up to 2000 µm.

4. The method as claimed in claim 3, wherein each of said microchips have a thickness that is at least 40 µm, a width that is at least 200 µm and/or a length that is at least 200 µm.

5. The method as claimed in claim 1, wherein said ferromagnetic layer has a thickness between 500 nm and 100 µm.

6. The method as claimed in claim 5, wherein said ferromagnetic layer has a thickness between 1 µm and 5 µm.

7. The method as claimed in claim 1, wherein said stripes are multiple stripes that are parallel to each other.

8. The method as claimed in claim 1, wherein said application and movement of said one or more magnetic fields include switching polarity of the magnetic fields.

9. The method as claimed in claim 1, wherein said holes are shaped such that each allow only specific microchip orientation or orientations for insertion into the hole.

10. The method as claimed in claim 9, wherein said microchips have a wide end that is wider than an opposite, thus narrow, end, and wherein the holes are shaped such that each allow only the narrow end of the microchip to enter the hole.

11. The method as claimed in claim 1, wherein the method further comprises:
vibrating the substrate during said application and movement of the magnetic field to reduce friction and facilitate the move of the microchips over the substrate surface.

12. The method as claimed in claim 1, wherein said out-of-plane orientation is perpendicular to said substrate surface.

13. A microchip assembly arrangement for assembling one or more microchips into one or more holes, respectively, in a substrate surface of a separate receiving substrate, wherein said microchip assembly arrangement is configured to:
obtain the substrate, the holes thereof for microchip insertion out-of-plane in relation to said substrate surface;
obtain said microchips, each provided with a ferromagnetic layer of ferromagnetic material;
place the microchips on said substrate surface; and
apply and move one or more magnetic fields affecting said ferromagnetic layer of each microchip such that the microchips become out-of-plane oriented in relation to said substrate surface and move over the substrate surface until assembled into said holes, and wherein in said ferromagnetic layer is patterned in one or more straight stripes with an orientation to result in directional lifting along said one or more stripes during said application of the magnetic field and cause said out-of-plane orientation.

14. The microchip assembly arrangement as claimed in claim 13, wherein said microchip assembly arrangement being configured to obtain the microchips comprises that that the microchip assembly arrangement is configured to, during fabrication of said microchips, provide each microchip with said ferromagnetic layer.

15. The microchip assembly arrangement as claimed in claim 13, wherein each of said microchips have a thickness up to 1000 μm, a width up to 4000 μm and/or a length up to 2000 μm.

16. The microchip assembly arrangement as claimed in claim 15, wherein each of said microchips have a thickness that is at least 40 μm, a width that is at least 200 μm and/or a length that is at least 200 μm.

17. The microchip assembly arrangement as claimed in claim 13, wherein said ferromagnetic layer has a thickness between 500 nm and 100 μm.

18. The microchip assembly arrangement as claimed in claim 17, wherein said ferromagnetic layer has a thickness between 1 μm and 5 μm.

19. The microchip assembly arrangement as claimed in claim 13, wherein said stripes are multiple stripes that are parallel to each other.

20. The microchip assembly arrangement as claimed in claim 13, wherein said application and movement of said one or more magnetic fields include switching polarity of the magnetic fields.

21. The microchip assembly arrangement as claimed in claim 13, wherein said holes are shaped such that each allow only specific microchip orientation or orientations for insertion into the hole.

22. The microchip assembly arrangement as claimed in claim 13, wherein the microchip assembly arrangement is further configured to vibrate the substrate during said application and movement of the magnetic field to reduce friction and facilitate the move of the microchips over the substrate surface.

23. The microchip assembly arrangement as claimed in claim 13, wherein said out-of-plane orientation is perpendicular to said substrate surface.

24. A microchip assembly arrangement for assembling one or more microchips into one or more holes, respectively, in a substrate surface of a separate receiving substrate, wherein said microchip assembly arrangement is configured to:
obtain the substrate, the holes thereof for microchip insertion out-of-plane in relation to said substrate surface;
obtain said microchips, each provided with a ferromagnetic layer of ferromagnetic material;
place the microchips on said substrate surface; and
apply and move one or more magnetic fields affecting said ferromagnetic layer of each microchip such that the microchips thereby become out-of-plane oriented in relation to said substrate surface and move over the substrate surface until assembled into said holes, and
wherein said holes are shaped such that each allow only specific microchip orientation or orientations for insertion into the hole, and
wherein said microchips have a wide end that is wider than an opposite, thus narrow, end, and wherein the holes are shaped such that each allow only the narrow end of the microchip to enter the hole.

* * * * *